(12) United States Patent  
Hsu et al.

(10) Patent No.: US 12,446,149 B2  
(45) Date of Patent: Oct. 14, 2025

(54) FLEXIBLE PRINTED CIRCUIT BOARD WITH EMBEDDED OPTICAL WAVEGUIDE STRUCTURE

(71) Applicant: CYNTEC CO., LTD., Hsinchu (TW)

(72) Inventors: Chia-Fu Hsu, Hsinchu (TW); Chun-Yen Chen, Hsinchu (TW)

(73) Assignee: CYNTEC CO., LTD., Hsinchu (TW)

( * ) Notice: Subject to any disclaimer, the term of this patent is extended or adjusted under 35 U.S.C. 154(b) by 218 days.

(21) Appl. No.: 18/373,263

(22) Filed: Sep. 26, 2023

(65) Prior Publication Data

US 2025/0106987 A1 Mar. 27, 2025

(51) Int. Cl.
  H05K 1/02 (2006.01)
  H05K 3/00 (2006.01)
  H05K 3/18 (2006.01)
  H05K 3/40 (2006.01)

(52) U.S. Cl.
  CPC .......... H05K 1/028 (2013.01); H05K 3/0094 (2013.01); H05K 3/188 (2013.01); H05K 3/4007 (2013.01); H05K 2201/0367 (2013.01); H05K 2201/09985 (2020.08); H05K 2201/10121 (2013.01)

(58) Field of Classification Search
  CPC ...... H05K 1/028; H05K 3/0094; H05K 3/188; H05K 3/4007; H05K 2201/09985; H05K 2201/0367; H05K 2201/10121
  USPC .......................................................... 361/749
  See application file for complete search history.

(56) References Cited

U.S. PATENT DOCUMENTS

| | | | |
|---|---|---|---|
| 2011/0007998 A1* | 1/2011 | Yamamoto | G02B 6/43 156/182 |
| 2019/0306988 A1* | 10/2019 | Grober | H05K 1/112 |
| 2020/0163218 A1* | 5/2020 | Mok | H05K 3/4038 |
| 2021/0088723 A1 | 3/2021 | Yu | |
| 2021/0356682 A1 | 11/2021 | Shen | |
| 2023/0258893 A1 | 8/2023 | Okawa | |
| 2023/0280554 A1 | 9/2023 | Okawa | |

FOREIGN PATENT DOCUMENTS

| | | |
|---|---|---|
| CN | 113692106 A | 11/2021 |
| TW | 202113409 A | 4/2021 |
| TW | 202208905 A | 3/2022 |
| TW | 202209700 A | 3/2022 |

* cited by examiner

*Primary Examiner* — Binh B Tran

(74) *Attorney, Agent, or Firm* — Winston Hsu

(57) ABSTRACT

A flexible printed circuit board with embedded optical waveguide structure, including a photoelectric transmission unit, wherein the photoelectric transmission unit includes a flexible insulation layer, a first optoelectronic unit and a second optoelectronic unit embedded in the photoelectric transmission unit, at least one redistribution layer having at least one conductive structure stacked with the flexible insulation layer and electrically connected with the first optoelectronic unit and second optoelectronic unit, an optical waveguide structure stacked with the flexible insulation layer, a first metal bump and a second metal bump adjacent to the optical waveguide structure and in optical alignment respectively with the first optoelectronic unit and the second optoelectronic unit to provide reflection planes for optical signal, wherein first metal bump and second metal bump are solid structures made of the same material as the one of redistribution layer.

25 Claims, 10 Drawing Sheets

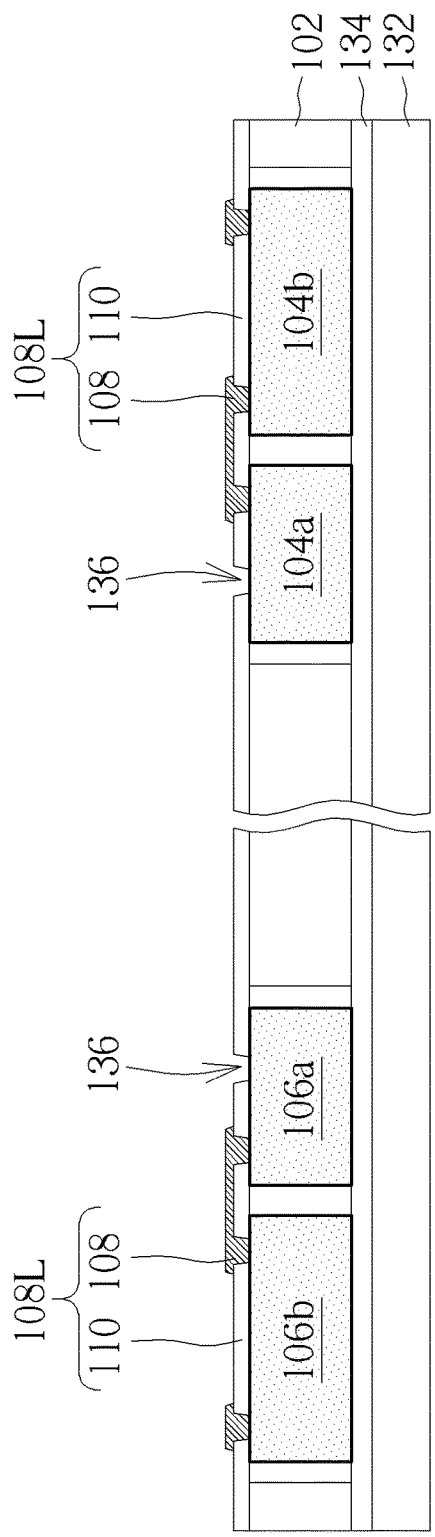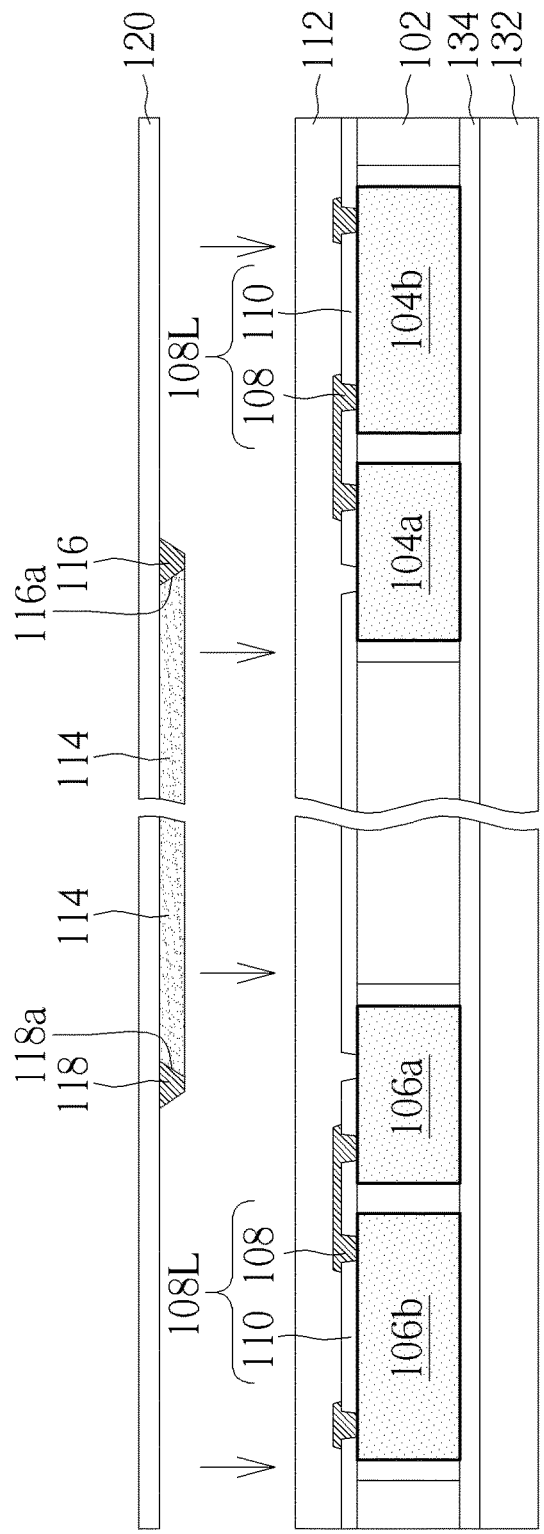

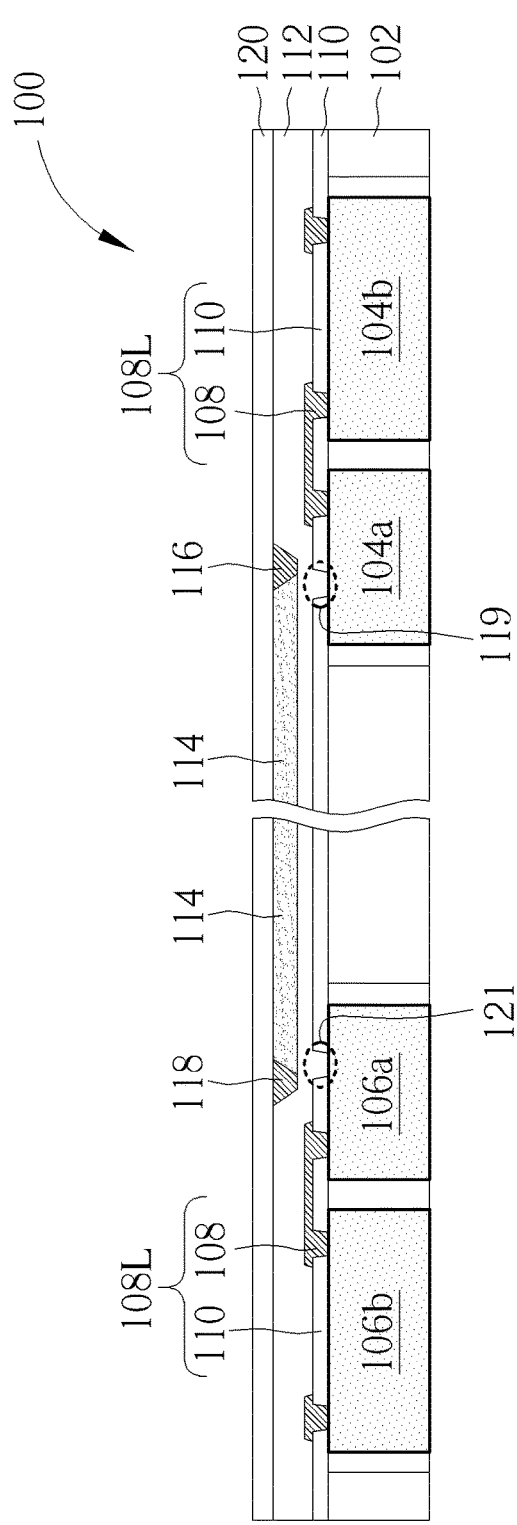
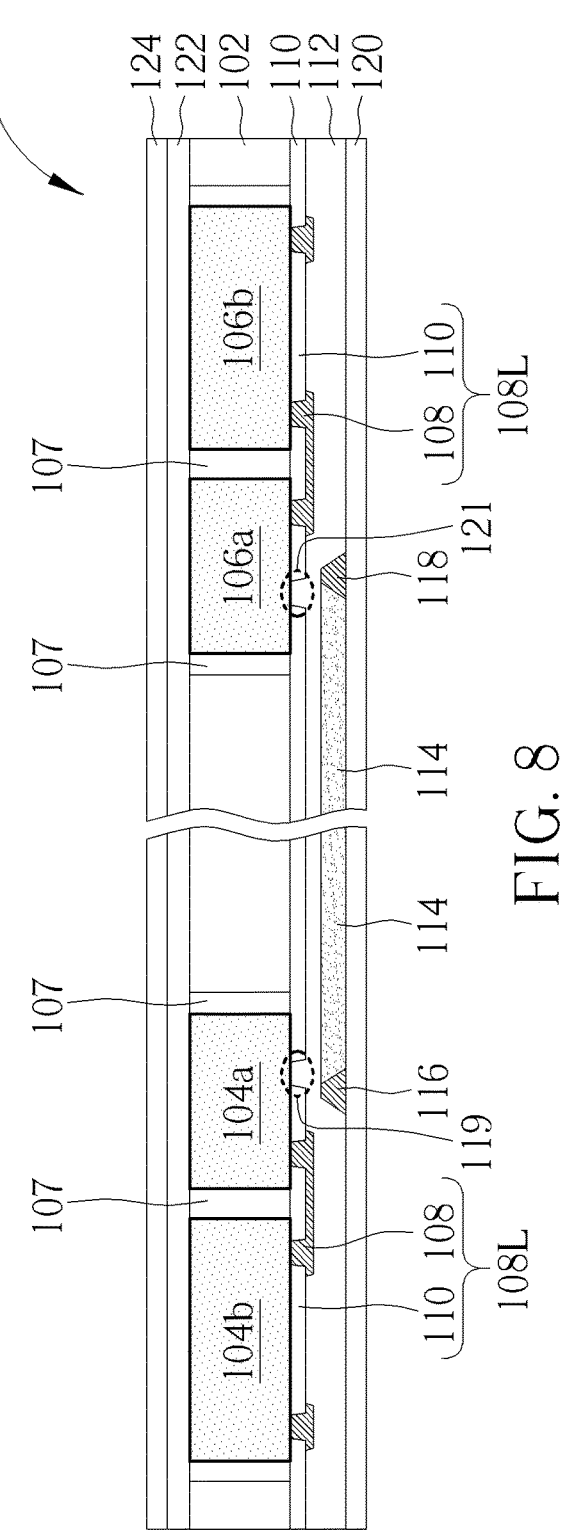
FIG. 7
FIG. 8

FLEXIBLE PRINTED CIRCUIT BOARD
WITH EMBEDDED OPTICAL WAVEGUIDE
STRUCTURE

BACKGROUND OF THE INVENTION

1. Field of the Invention

The present invention relates generally to a flexible printed circuit board, and more specifically, to a flexible printed circuit board with embedded optical waveguide structure.

2. Description of the Related Art

Most of conventional flexible printed circuit boards are made of copper wires and dielectrics and transmit data or information in the form of electrical signal. With high demand for greater signal bandwidth, the transmission through copper wires may suffer high signal loss that deteriorating the quality of signal transmission, and accordingly, available transmission distance should be inevitably decreased. In comparison thereto, light signal transmitted through optical waveguide is provided with the properties of high frequency and low loss to reduce transmission loss and improve the signal quality in high-frequency transmission, thus it is suitable to be used in high-speed transmission between board-to-board, chip-to-chip, mobile module-to-mainboard, chip interconnection in servers of data center, or chip-to-module in high density switch.

In conventional skill of optical waveguide flexible printed circuit boards, optoelectronic units, relevant reflective components and/or waveguide structures are mounted on the surface of flexible layer or flexible substrate. This kind of design may substantially increase the thickness of entire flexible printed circuit board, and layer build-up process may not be performed once the dies are mounted, thereby reducing the number of stackable waveguide layers or units. Accordingly, those of skilled in the art still need to improve the structure of waveguide flexible printed circuit board in order to increase the density of waveguide circuit and reduce the thickness of overall structure.

SUMMARY OF THE INVENTION

In the light of the aforementioned current situation of conventional skill, the present invention hereby provides a flexible printed circuit board with embedded optical waveguide structure, featuring the optical waveguide structures embedded in the flexible layers through build-up process to reduce the thickness, and required reflective structures may be formed simultaneously in the process of forming the circuit patterns for electrical signal, thus the process complexity and steps may be significantly reduced to improve the alignment between reflective plane and the optical devices.

One aspect of the present invention is to provide a flexible printed circuit board with embedded optical waveguide structure, comprising at least one photoelectric transmission unit, wherein each photoelectric transmission unit includes a flexible insulation layer, a first optoelectronic unit embedded in the photoelectric transmission unit and configured to convert electrical signal into optical signal, a second optoelectronic unit embedded in the photoelectric transmission unit and configured to convert optical signal into electrical signal, at least one redistribution layer having at least one conductive structure stacked with the flexible insulation layer and electrically connected with the first optoelectronic unit and second optoelectronic unit, an optical waveguide structure stacked with the flexible insulation layer for transmitting optical signal, a first metal bump adjacent to the optical waveguide structure and in optical alignment with the first optoelectronic unit to provide a reflection plane for optical signal, a second metal bump adjacent to the optical waveguide structure and in optical alignment with the second optoelectronic unit to provide a reflection plane for optical signal, and a first flexible cover layer covering on the first metal bump, second metal bump and the optical waveguide structure, wherein the first metal bump and second metal bump are solid structures made of the same material as the one of the conductive structure of the redistribution layer.

The other aspect of the present invention is to provide a method of manufacturing a flexible printed circuit board with embedded optical waveguide structure, including steps of embedding a first optoelectronic unit and a second optoelectronic unit in a flexible insulation layer, forming a redistribution layer on the first optoelectronic unit, the second optoelectronic unit and the flexible insulation layer, forming a first metal bump, a second metal bump and an optical waveguide structure on a first flexible cover layer, and bonding the first flexible cover layer on one side of the flexible insulation layer, the first optoelectronic unit and the second optoelectronic unit, wherein said optical waveguide structure is in optical alignment respectively with the first metal bump and the second metal bump on the first flexible cover layer, wherein the first metal bump and the second metal bump are solid structures made of the same material as the one of the conductive structure of the redistribution layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings:

FIG. 3 to FIG. 8 are schematic cross-sectional views illustrating a process flow of manufacturing a photoelectric transmission unit with embedded optical waveguide structure in accordance with the preferred embodiment of present invention;

Figure 1:
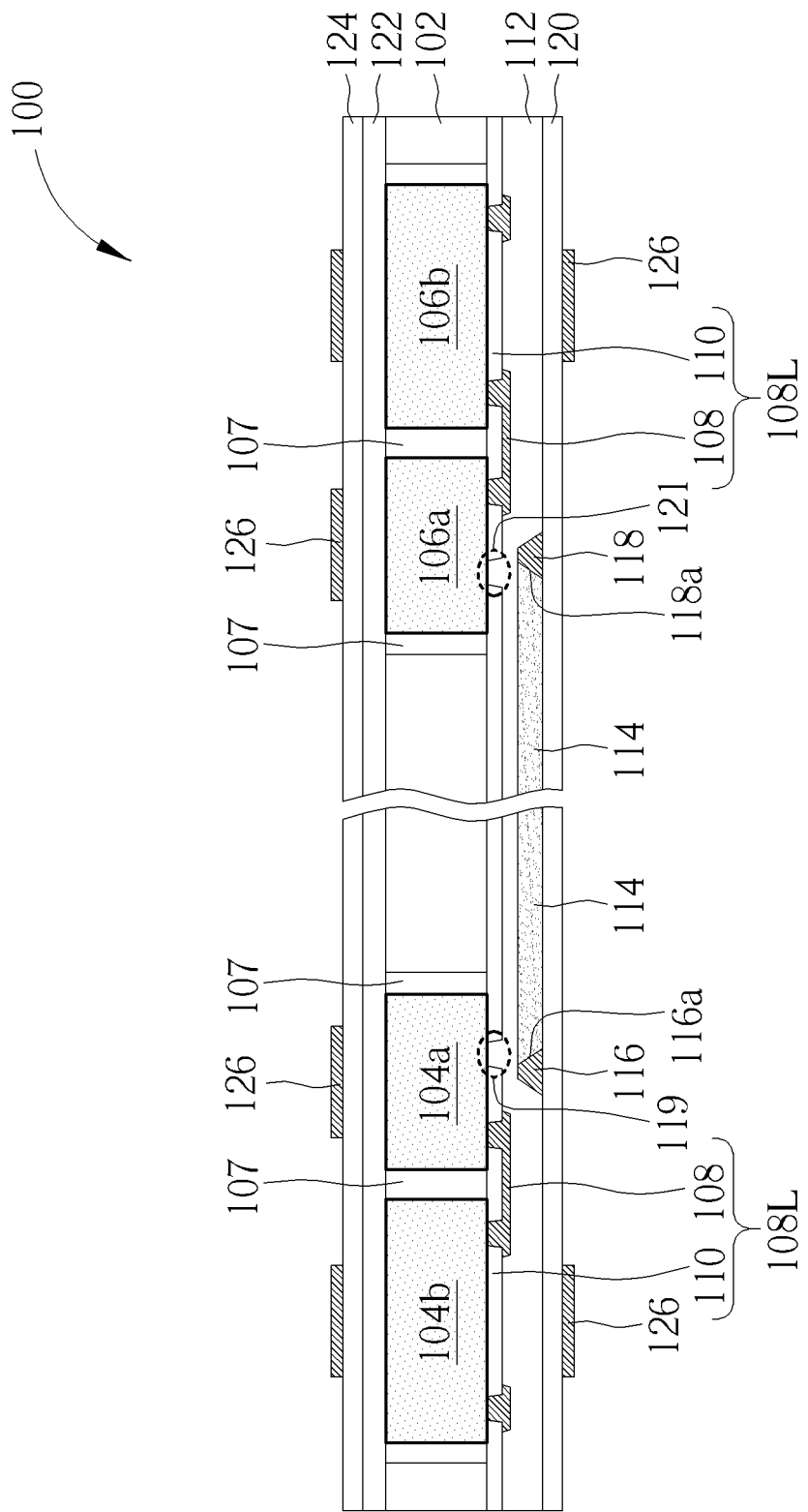
FIG. 1 is a schematic cross-sectional view of a photoelectric transmission unit with embedded optical waveguide structure in accordance with the preferred embodiment of present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Dimensions and proportions of certain parts of the drawings may have been shown exaggerated or reduced in size, for the sake of clarity and convenience in the drawings. Other embodiments may be utilized and structural, logical, and electrical changes may be made without departing from the scope of the present invention. The following detailed description, therefore, is not to be taken in a limiting sense, and the scope of the present invention is defined by the appended claims.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). Further, spatially relative terms, such as "beneath," "below," "lower," "above," "upper," and the like, may be used herein for ease of description to describe one element or feature's relationship to another element(s) or feature(s) as illustrated in the figures.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or heterogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

First, please refer to FIG. 1, which is a schematic cross-sectional view of a photoelectric transmission unit with embedded optical waveguide structure in accordance with the preferred embodiment of present invention. As shown in FIG. 1, the photoelectric transmission unit 100 of present invention substantially includes an inner flexible insulation layer 102 as a base for supporting entire structure. The flexible insulation layer 102 may be a modified polyimide (PI) layer with excellent properties like low-k dielectric, heat resistance and chemical resistance. The polyimide layer may be surface-modified by wet etching process and/or absorb metal catalyst to provide better adhesive property and solderability, depending on requirement of the invention.

In the preferred embodiment of present invention, optoelectronic units 104a, 104b, 106a, 106b for the operation of converting optical signal and electrical signal are embedded in the flexible insulation layer 102. At one end of the photoelectric transmission unit 100, the optoelectronic units may include a vertical cavity surface emitting laser (VCSEL) diode 104a and a VCSEL driver 104b. The VCSEL diode 104a may be made of gallium nitride (GaN) epitaxy and metal electrodes, which can emit laser beam in a low divergence angle from a predetermined light-emitting position 119 on the surface of VCSEL diode 104a. The orientation of the emitting laser beam is preferably vertical to the surface of flexible insulation layer 102. In the embodiment of present invention, multiple VCSEL diodes 104a may be arranged in a 2D laser array in the flexible insulation layer 102 to achieve maximum output power. The VCSEL driver 104b is used to control the emitting of VCSEL diode 104a, which may consist of circuits like equalizer, high-speed current modulator, modulation current generator, power-on reset circuitry, control logic block, and bias current generator. In other embodiment, the VCSEL diode 104a and VCSEL driver 104b may be formed optionally on the surface of flexible insulation layer 102.

Refer still to FIG. 1. At the other end of the photoelectric transmission unit 100, the optoelectronic units may include a photodetector 106a and a transimpedance amplifier (TIA) 106b. In the embodiment of present invention, the photodetector 106a may be a common photodiode, avalanche photodiode (APD), single photon avalanche diodes (SPAD) or silicon photomultiplier (SiPM), which is used to transform light from optical waveguide structure 114 into a current or voltage that can then be used in electronic circuits. The photodetector 106a may receive laser beam resulted from the VCSEL diode 104a at the other end. The introduced laser beam is irradiated at a light-receiving position 121 on the surface of photodetector 106a. The orientation of incident laser beam is preferably vertical to the surface of flexible insulation layer 102. Similarly, multiple photodetector 106a may be arranged in a detector array in the flexible insulation layer 102. Furthermore, for the applications requiring high speed and high signal bandwidth, transimpedance amplifier 106b is used in the embodiment to convert photocurrent resulted from the photodetector 106a into voltage signal, and the voltage signal may then be amplified and used in post digital circuit. The transimpedance amplifier 106b may consist of circuits like operational amplifier and feedback resistor. In other embodiment, the VCSEL diode 104a and VCSEL driver 104b may also be formed optionally on the surface of flexible insulation layer 102.

Refer still to FIG. 1. The gaps between optoelectronic units 104a, 104b, 106a and 106b or between optoelectronic units 104a, 104b, 106a and 106b and flexible insulation layer 102 may be filled with underfill 107. The material of underfill 107 may be epoxy, which can be filled in the gaps through dispensing and then be thermally cured. Preferably, top surfaces and bottom surfaces of the embedded optoelectronic units 104a, 104b, 106a and 106b, the cured underfill 107 and the flexible insulation layer 102 are flush in order to facilitate later lamination process. In the embodiment of present invention, at least one redistribution layer (RDL) 108L having at least one dielectric film 110 and at least one conductive structure 108 in/on the dielectric film 110 is formed on the flexible insulation layer 102. The conductive structure 108 of the redistribution layer 108L is electrically connected the optoelectronic units 104a, 104b, 106a and 106b. Specifically, a dielectric film 110, such as a polyimide film, is formed in advance on the surface of flexible insulation layer 102 and optoelectronic units 104a, 104b, 106a and 106b, and the conductive structure 108 of the redistribution layer 108L is then formed in/on the dielectric film 110 and electrically connected with the optoelectronic units 104a, 104b, 106a and 106b through the openings of dielectric film 110. The material of the conductive structure of redistribution layer 108L may be metal material like copper (Cu), silver (Ag), nickel (Ni), aluminum (Al), gold (Au) or the alloy thereof. The optoelectronic units 104a, 104b, 106a and 106b may be electrically connected to other interconnections in the flexible printed circuit (FPC) board or outer printed circuit boards (PCBs) through the conductive structure 108 of the redistribution layer 108L. The openings of dielectric film 110 are also formed correspondingly on the light-emitting position 119 of VCSEL diode 104a and the light-receiving position 121 of photodetector 106a to provide light transmission path.

Refer still to FIG. 1. An adhesion layer 112 is formed on the dielectric film 110 and the conductive structure 108 of the redistribution layer 108L to provide adhesion for bonding outer laminate layers or structures. The material of adhesion layer 112 may be epoxy or polyimide, and the adhesion layer 112 may be filled in the openings on the light-emitting position 119 and light-receiving position 121 without blocking the transmission of optical signal. An outermost flexible cover layer 120 is covered and bonded on the adhesion layer 112, wherein a first metal bump 116, an optical waveguide structure 114 and a second metal bump 118 are set between the adhesion layer 112 and the flexible cover layer 120 to constitute a light transmission path. In the preferred embodiment of present invention, the first metal bump 116 and the second metal bump 118 are set in optical alignment respectively with the optoelectronic unit 104a (ex. VCSEL diode) and the optoelectronic unit 106a (ex. photodetector) to provide reflection planes 116a, 118a for optical signal. More specifically, the reflection plane 116a of first metal bump 116 is in optical alignment with the light-emitting position 119 of optoelectronic unit 104a, and the reflection plane 118a of second metal bump 118 is in optical alignment with the light-receiving position 121 of optoelectronic unit 106a, so that the emitted optical signal may be reflected by the reflection planes 116a, 118a. In addition, circuit pattern 126 for electrical signal may be formed on the outer surface of the flexible cover layer 120 if necessary.

Furthermore, as shown in FIG. 1, the optical waveguide structure 114 is formed between the first metal bump 116 and the second metal bump 118. In the preferred embodiment of present invention, the optical waveguide structure 114 is set designedly adjacent to the reflection planes 116a, 118a of first metal bump 116 and second metal bump 118, so that the optical signal reflected by the reflection planes 116a, 118a may be transmitted in the optical waveguide structure 114 without being scattered. In the operation, the optical signal emitted from the light-emitting position 119 of VCSEL diode 104a at one end is reflected by the reflection plane 116a of first metal bump 116 and introduced into the optical waveguide structure 114. The optical signal is then transmitted in the optical waveguide structure 114 to the other end of the photoelectric transmission unit 100 through total internal reflection, and the optical signal is further reflected toward the light-receiving position 121 of photodetector 106a by the reflection plane 118a of second metal bump 118, and the optical signal may be converted to electrical signal for example voltage signal that may be digital signal for the photodetector 106a.

In the embodiment of present invention, the material of flexible cover layer 120 may be modified polyimide like the one of flexible insulation layer 102 to provide properties like low-k dielectric, heat resistance and chemical resistance, while the material of optical waveguide structure 114 may be polyimide or cyclo-olefin polymer (COP) with excellent optical properties, including high transparency, low birefringence, low water absorption and good heat resistance. It's worth mentioning that, in the embodiment of present invention, the first metal bump 116 and second metal bump 118 are completely made of metal material like copper (Cu), silver (Ag), nickel (Ni), aluminum (Al), gold (Au) or the alloy thereof, including their outer reflection planes and inner structures. This feature allow them being easily formed on the flexible cover layer 120 through the same manufacturing device or manufacturing process for example plating process as the conductive structure 108 of redistribution layer 108L, which will be described in details in later embodiment.

Refer still to FIG. 1. The aforementioned components like redistribution layer 108L, metal bump 116, 118 and optical waveguide structure 114 are all formed on one side of the flexible insulation layer 102. In the embodiment of present invention, the other side of the flexible insulation layer 102 may also be bonded by a flexible cover layer 124 through an adhesion layer 122, and circuit pattern 126 may also be formed on the outer surface of the flexible cover layer 124 if necessary.

Figure 16:
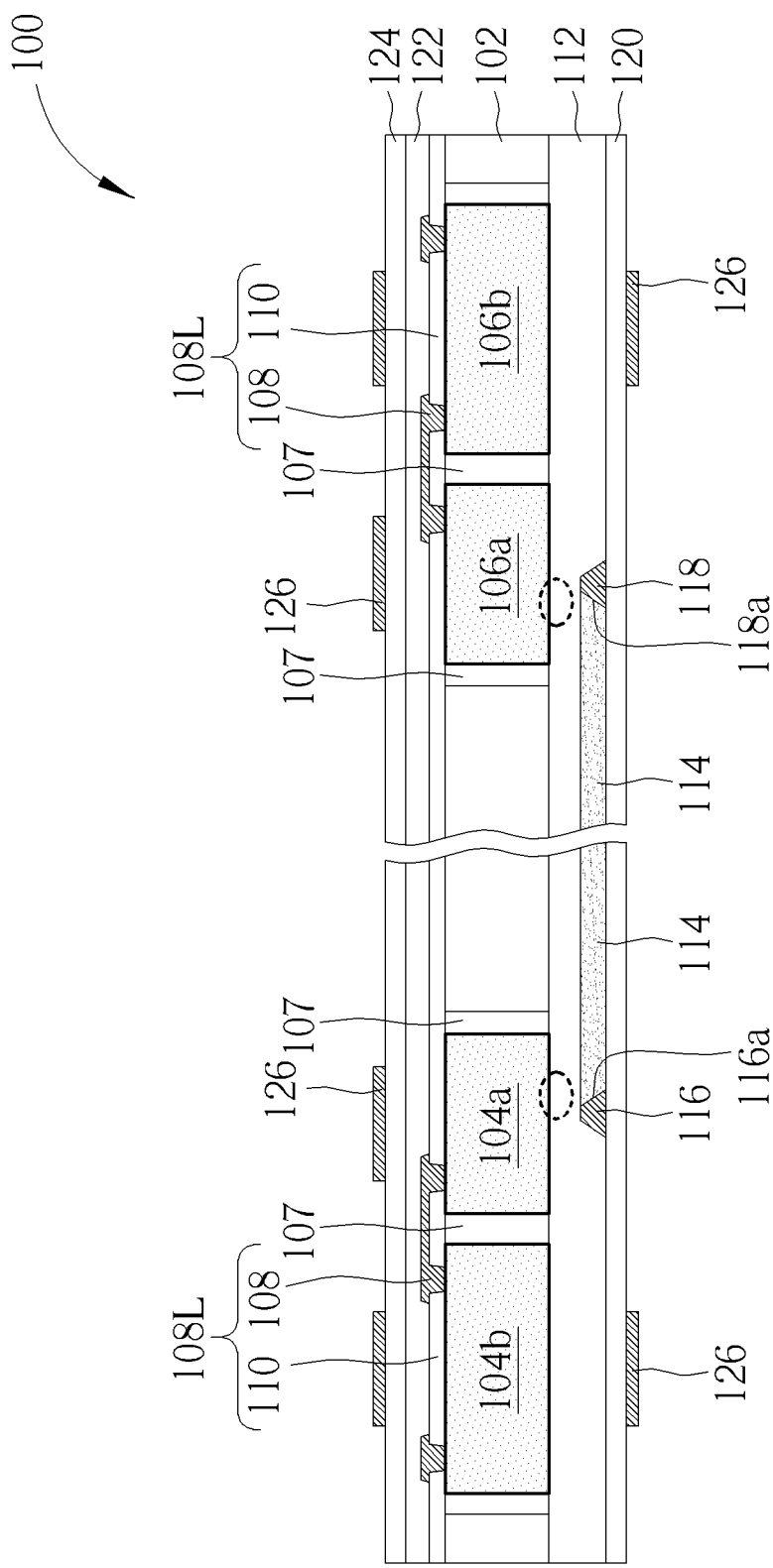
FIG. 16 is a schematic cross-sectional view of a photoelectric transmission unit with embedded optical waveguide structure in accordance with another embodiment of present invention.

In the aforementioned embodiment, the redistribution layer 108L and the optical waveguide structure 114 are stacked at the same side of the flexible insulation layer 102. In other embodiment, as shown in FIG. 16, the redistribution layer 108L and the optical waveguide structure 114 may be stacked at opposite sides of the flexible insulation layer 102. In this embodiment, since light transmission path will not be blocked by the dielectric film 110 of the redistribution layer 108L, openings for light transmission path are not necessarily provided in the dielectric film 110 of the redistribution layer 108L. In still another embodiment of the present invention, two sides of the flexible insulation layer 102 may be stacked with the redistribution layer 108L and the optical waveguide structure 114.

Figure 2:
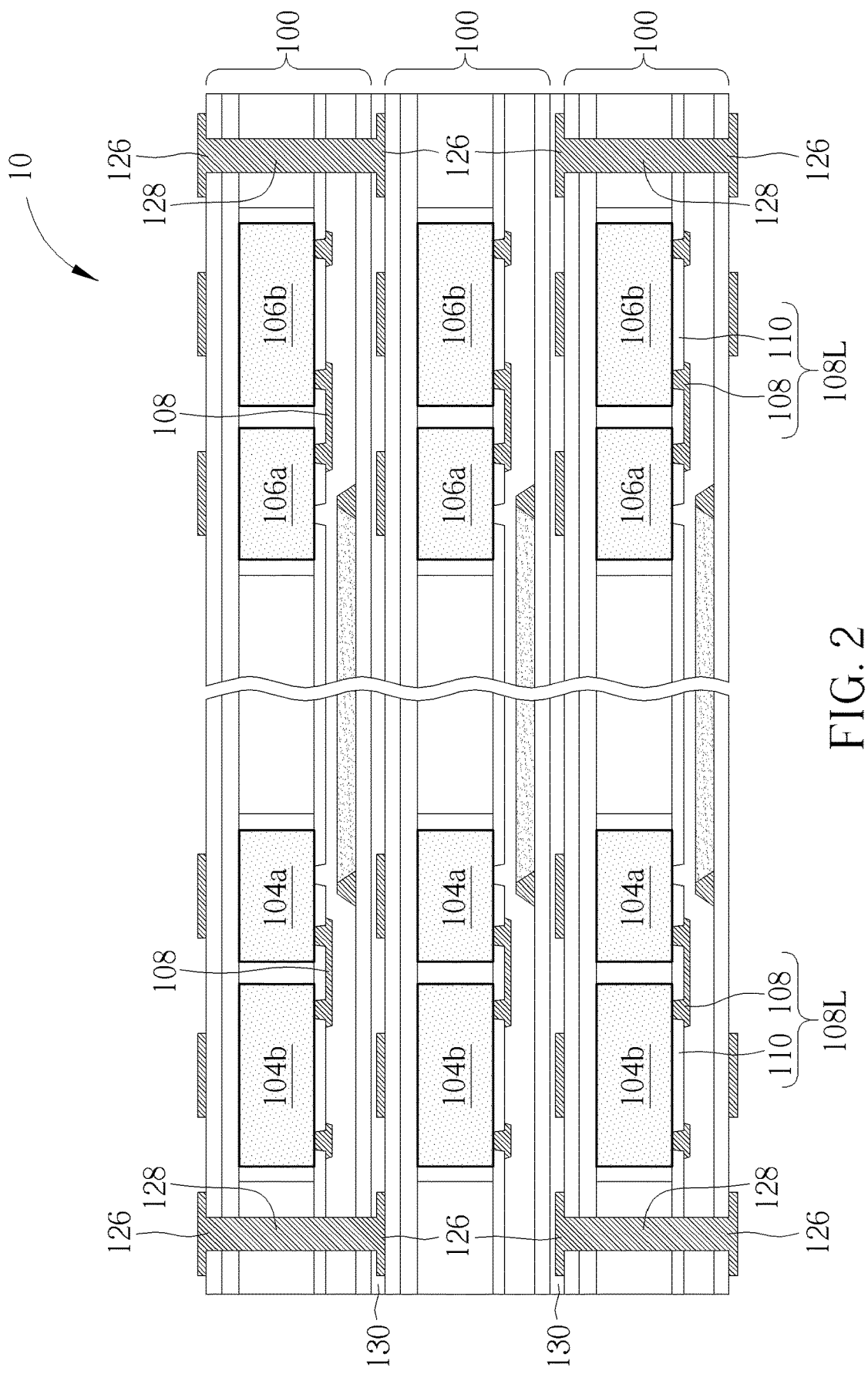
FIG. 2 is a schematic cross-sectional view of a flexible printed circuit board with embedded optical waveguide structure in accordance with the preferred embodiment of present invention.

Please refer now to FIG. 2. In the embodiment of present invention, multiple aforementioned photoelectric transmission units 100 may be laminated to constitute a flexible printed circuit (FPC) board 10. As shown in FIG. 2, three exemplified photoelectric transmission units 100 are laminated and bonded through adhesion layers 130, ex. epoxy or polyimide layer, to form multilayered light transmission paths, wherein photoelectric transmission units 100 may be electrically connected with each other or with outer circuit patterns 126 through the conductive structure 108 of redistribution layers 108L and interconnections 128 extending through laminate layers of the photoelectric transmission units 100, and they may be further connected electrically and collectively to outer circuits like system printed circuit boards (PCBs) through contacts or connectors like gold fingers or solder bumps.

After describing the structure of photoelectric transmission unit 100 and flexible printed circuit board 10 of present invention, process flow of manufacturing the photoelectric transmission unit with embedded optical waveguide structure in accordance with the preferred embodiment of present invention will now be described with reference to FIG. 3 to FIG. 8.

Figure 3:
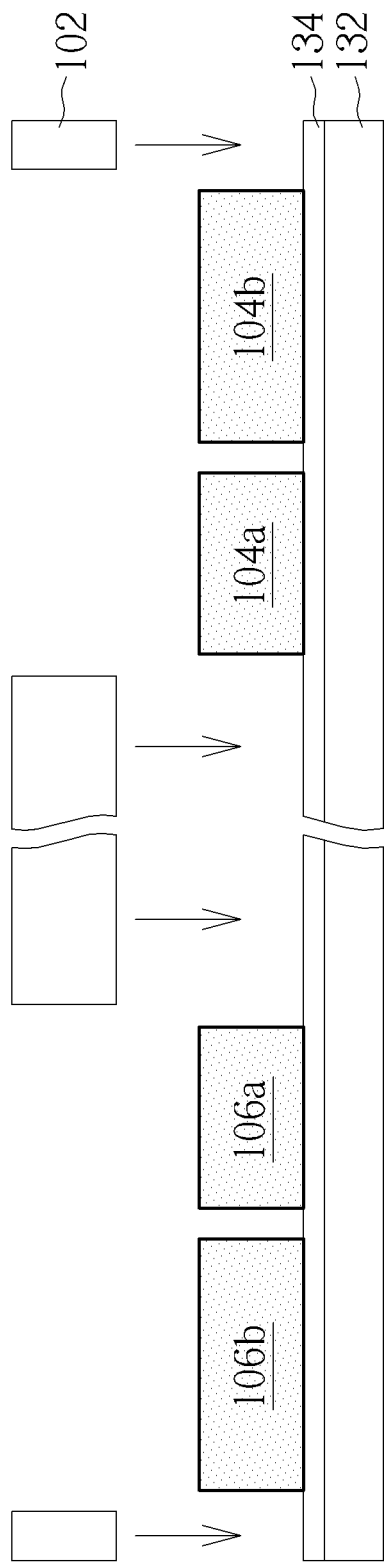

Please refer to FIG. 3. At the beginning of the process, provide a temporary substrate 132 as a base for devices and layer structures to be attached or formed thereon in the process. The temporary substrate 132 may be a substrate with low coefficient of thermal expansion, ex. glass substrate. An intermediate layer 134 is formed on the temporary substrate 132 to function as a release film or release paper, such as polyester (PET) film or polyimide film coated with silicone gel, providing good heat resistance, glue resistance, fillability and separability. After the temporary substrate 132 and intermediate layer 134 are prepared, the optoelectronic units 104a, 104b, 106a and 106b are attached on the intermediate layer 134. The intermediate layer 134 may provide moderate adhesion to fix the optoelectronic units 104a, 104b, 106a and 106b on the temporary substrate 132. After the optoelectronic units 104a, 104b, 106a and 106b are attached, a flexible insulation layer 102 is laminated on the intermediate layer 134. The flexible insulation layer 102 may be a modified polyimide (PI) layer with excellent properties like low-k dielectric, heat resistance and chemical resistance. In the embodiment of present invention, the flexible insulation layer 102 is provided with predetermined opening patterns so that the optoelectronic units 104a, 104b, 106a and 106b fixed on the intermediate layer 134 will be located in the opening patterns after the flexible insulation layer 102 is laminated.

Figure 4:
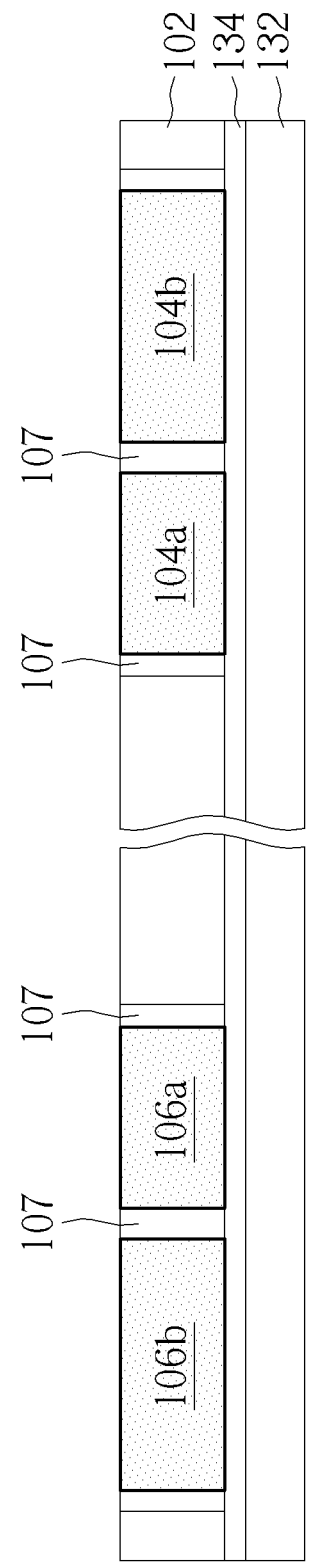
Figure 9:
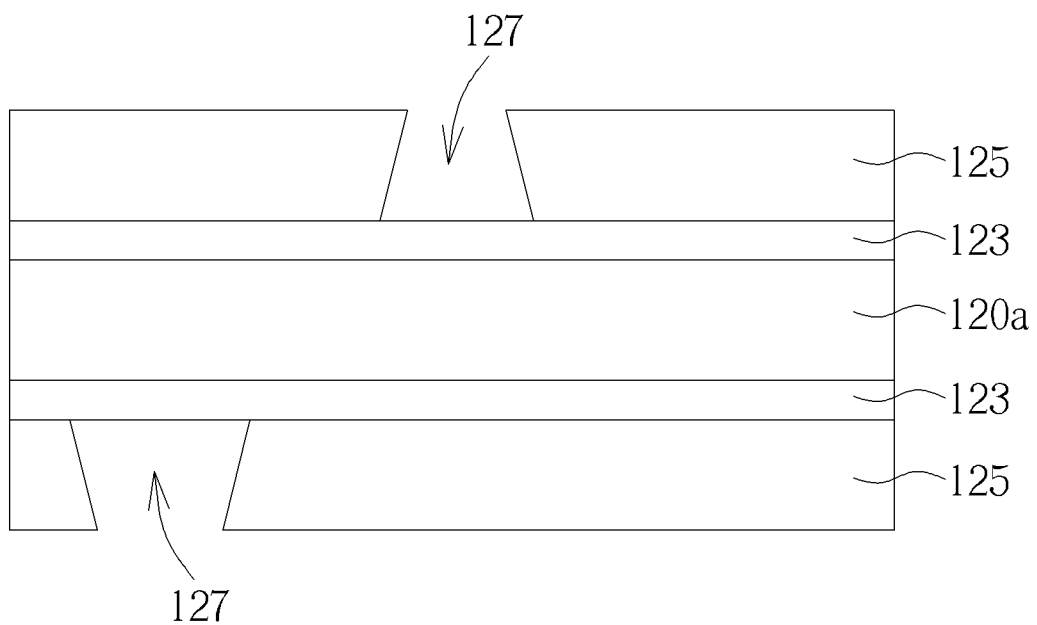
FIG. 9 to FIG. 12 are schematic cross-sectional views illustrating a process flow of manufacturing a reflective metal bump on a flexible cover layer in accordance with the preferred embodiment of present invention.

Please refer to FIG. 4. After the flexible insulation layer 102 is laminated, gaps may be formed between the optoelectronic units 104a, 104b, 106a and 106b or between the optoelectronic units 104a, 104b, 106a and 106b and the flexible insulation layer 102. In the embodiment of present invention, these gaps are filled with underfill 107, such as epoxy, which can be filled in the gaps through dispensing and then be thermally cured. Underfill 107 may improve mechanical strength and reliability of entire flexible printed circuit board, preventing issues like device displacement, breakage or peeling of solder joints during thermal cycles of the FPC product. Preferably, top surfaces and bottom surfaces of the embedded optoelectronic units 104a, 104b, 106a and 106b, the cured underfill 107 and the flexible insulation layer 102 are flush in order to facilitate the lamination process later. In the present invention, since optoelectronic units 104a, 104b, 106a and 106b are embedded in the flexible insulation layer 102, following FPC build-up process may be performed without hindrance or additional steps, to increase the transmission density. In addition, since the underfill 107 is filled in the gaps at lateral sides of optoelectronic units without blocking the light transmission path, so that the signal loss may be reduced and available underfill 107 may be opaque.

Please refer to FIG. 5. After the underfill 107 is filled, at least one conductive structure 108 and at least one dielectric film 110 of a redistribution layer 108L is then formed on the flexible insulation layer 102 to electrically connect the optoelectronic units 104a, 104b, 106a and 106b. Specifically, a dielectric film 110, such as a modified polyimide film, is formed firstly on the surface of flexible insulation layer 102 and optoelectronic units 104a, 104b, 106a and 106b. Opening patterns or producing conductive patterns will be formed in the dielectric film 110 through photolithography process or plating process to allow the interconnection between the conductive structure 108 of the redistribution layer 108L and the optoelectronic units 104a, 104b, 106a and 106b. The conductive structure 108 of the redistribution layer 108L may be formed in/on the dielectric film 110 by first depositing a metal layer on the dielectric film 110 through electroplating process or chemical plating and then patterning the metal layer to form patterned RDL circuit through photolithography process. The material of the conductive structure 108 of redistribution layer 108L may be metal material like copper (Cu), silver (Ag), nickel (Ni), aluminum (Al), gold (Au) or the alloy thereof. The metal layer formed in the opening patterns functions as contacts for connections between the conductive structure 108 of the redistribution layer 108L and optoelectronic units 104a, 104b, 106a and 106b. In the embodiment of present invention, some openings 136 are designedly remained on the optoelectronic units (i.e. VCSEL diode) 104a and the optoelectronic units (i.e. photodetector) 106a to provide light transmission path.

Please refer to FIG. 6. After the redistribution layer 108L is formed, an adhesion layer 112 is laminated on the conductive structure 108 and dielectric film 110 of the redistribution layer 108L to provide adhesion for bonding outer laminate layers or structures. In the embodiment of present invention, the material of adhesion layer 112 may be polyimide (PI), polyesters (PET), acrylics and modified epoxies with high transparency, which may be laminated directly on the layer structures, and the adhesion layer 112 may be filled in the openings of dielectric film 110 without blocking the transmission of optical signal.

After the adhesion layer 112 is formed, an outer flexible cover layer (or may be referred as a capping layer) 120 is laminated on the adhesion layer 112. In the embodiment of present invention, one side of the flexible cover layer 120 is provided with two metal bumps 116, 118 and an optical waveguide structure 114, wherein the first metal bump 116, the optical waveguide structure 114 and the second metal bump 118 are set between the adhesion layer 112 and the flexible cover layer 120 to constitute a light transmission path. More specifically, the optical waveguide structure 114 is set designedly adjacent to the reflection planes 116a, 118a of first metal bump 116 and second metal bump 118, so that the optical signal reflected by the reflection planes 116a, 118a may be transmitted in the optical waveguide structure 114 without being scattered. The material of metal bumps 116, 118 may be metal material like the one of the conductive structures 108 of redistribution layer 108L, such as copper (Cu), silver (Ag), nickel (Ni), aluminum (Al), gold (Au) or the alloy thereof, which may be formed on the flexible cover layer 120 through electroplating process. The material of optical waveguide structure 114 may be polyimide or cyclo-olefin polymer (COP) with excellent optical properties, including high transparency, low birefringence, low water absorption and good heat resistance, which may be formed on the flexible cover layer 120 through blade coating process.

Please refer to FIG. 7. In the bonding process, the first metal bump 116 and the second metal bump 118 are set in optical alignment respectively with the optoelectronic unit 104a (ex. VCSEL diode) and the optoelectronic unit 106a (ex. photodetector) to provide reflection planes 116a, 118a for optical signal. More specifically, the reflection plane 116a of first metal bump 116 is in optical alignment with the light-emitting position 119 of optoelectronic unit 104a through the opening of dielectric film 110, and the reflection plane 118a of second metal bump 118 is in optical alignment with the light-receiving position 121 of optoelectronic unit 106a through the opening of dielectric film 110, so that the emitted optical signal may be reflected by the reflection planes 116a, 118a. In the present invention, since optical waveguide structure 114 is formed adjacent to the metal bumps 116, 118, the optoelectronic units 104a, 106a may be precisely aligned with the optical waveguide structure 114 through metal bumps 116, 118, thereby effectively reducing alignment tolerance. In addition, circuit patterns (not shown) may be formed on the other side of the flexible cover layer 120 if necessary. After the lamination of flexible cover layer 120, the temporary substrate 132 and the intermediate layer 134 may be easily peeled and removed from the flexible insulation layer 102 under appropriate releasing condition, ex. adequate releasing temperature or treatment.

Please refer to FIG. 8. After the temporary substrate 132 and the intermediate layer 134 are removed, the entire substrate is flipped over and turned onto opposite side. Similarly, the opposite side of flexible cover layer 120 is laminated with a flexible cover layer 124 through an adhesion layer 122. The material of flexible cover layer 124 may be modified polyimide, and the material of adhesion layer 122 may be epoxy or polyimide. Similarly, circuit patterns (not shown) may be formed on the other side of the flexible cover layer 124 if necessary.

After the photoelectric transmission units 100 are prepared, as shown in FIG. 2, multiple photoelectric transmission units 100 may be laminated through adhesion layers 130 to constitute a FPC board 10, and interconnections 128 may be formed in the laminate layers of FPC board 10 to electrically connect the conductive structures 108 of the redistribution layers 108L of photoelectric transmission units 100 on the optoelectronic units 104a, 104b, 106a and 106b and the outer circuit patterns 126, and these circuits may be further connected electrically and collectively to outer circuits like system printed circuit boards (PCBs) through contacts or connectors like sockets, gold fingers or solder bumps.

Please refer to FIG. 9 to FIG. 12, which are schematic cross-sectional views illustrating a process flow of manufacturing the reflective metal bump on the flexible cover layer in accordance with the preferred embodiment of present invention. One metal bump 116 and one circuit pattern 126 will be exemplified in these figures to describe the method of present invention. Please note that there may be multiple metal bumps and circuit patterns formed on the flexible cover layer, and they may be formed on the same side or different side of the flexible cover layer depending on the requirement of product.

As shown in previous embodiment, the metal bumps 116, 118 in the invention are formed in advance on the outer flexible cover layer 120 before they are attached on the substrate. Please refer to FIG. 9. The original flexible cover layer 120 before the process may be a flexible metal clad laminate for example flexible copper clad laminate (FCCL) consisted of a middle insulation layer (ex. polyimide layer) 120a and two cladding layers (ex. copper foils) 123 respectively on two sides of the insulation layer 120a. Photoresists 125 are formed respectively on the two cladding layers 123, wherein opening patterns 127 are formed in the photoresists 125 to define the shape of metal bumps through photolithography process. Expected shape of metal bump required by the present invention may be formed and adjusted by tuning the parameters in photolithography process.

Figure 10:
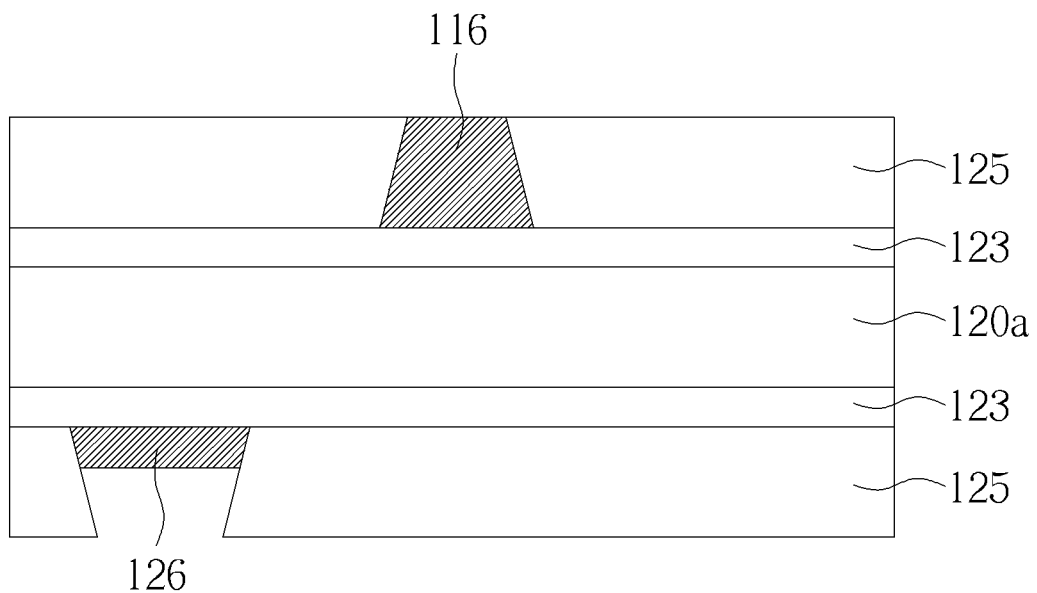

Please refer to FIG. 10. After the photoresists 125 are formed, an electroplating process is performed to form metal bump 116 and circuit pattern 126 on the cladding layers 123. Please note that in the present invention, the first metal bump 116 and second metal bump 118 are solid structures made of the same material as the ones of the conductive structures 108 of redistribution layer 108L, outer circuit patterns 126 or other interconnections in the FPC board like contacts. The material of metal bump 116 and circuit pattern 126 may be copper (Cu), silver (Ag), nickel (Ni), aluminum (Al), gold (Au) or the alloy thereof. The Cu-based cladding layers 123 may function as a seed layer in the electroplating process to grow metal bump 116 and circuit pattern 126, and the height of metal bump 116 or circuit pattern 126 may be controlled by the duration of electroplating process. In the present invention, since metal bump 116 and circuit pattern 126 may be formed simultaneously and integrated in the same process, process complexity and steps may be significantly reduced to improve the alignment between reflective plane and the optical devices and overall performance of signal transmission.

Figure 11:
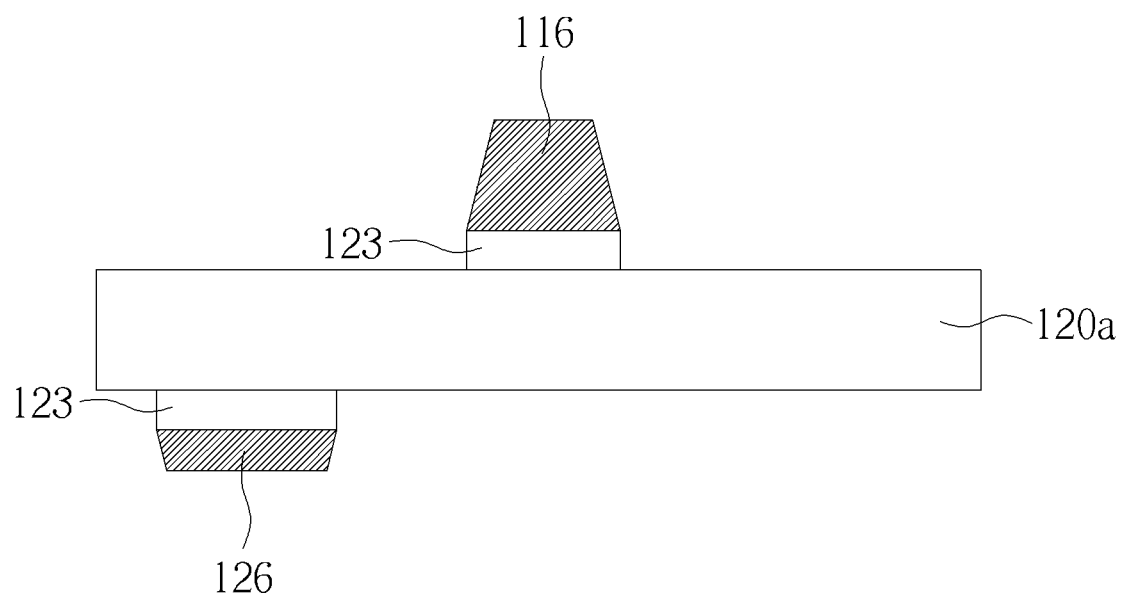

Please refer to FIG. 11. After the metal bump 116 and circuit pattern 123 are formed, the photoresists 125 are removed from the cladding layers 123. An etching process is then performed to remove the exposed cladding layers 123 from the insulation layer 120a, so as to isolate different metal bumps 116 and circuit patterns 126 on the insulation layer 120a.

Figure 12:
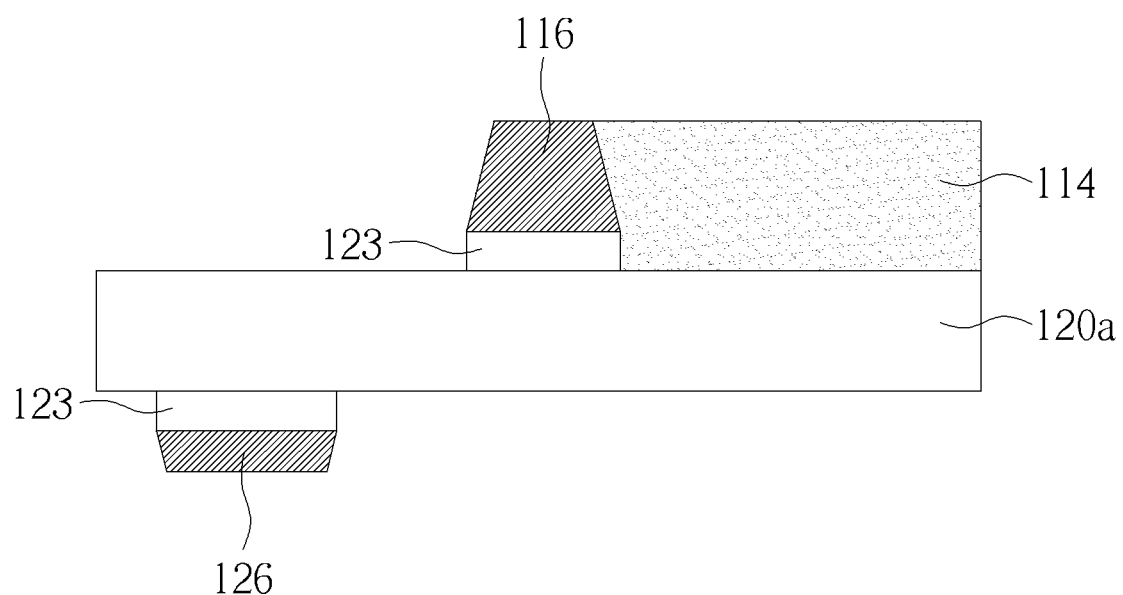

Please refer to FIG. 12. After the etching process, the optical waveguide structure 114 is formed on the insulation layer 120a through blade coating process or press bonding process with optical waveguide sheet. The material of optical waveguide structure 114 may be polyimide or cyclo-olefin polymer (COP). Preferably, the optical waveguide structure 114 is formed directly contacting one side of the metal bump 116 and cladding layer 123 in order to receive light signal reflected by the metal bump 116, and the surface of optical waveguide structure 114 is flush with the top surface of metal bump 116.

Figure 13:
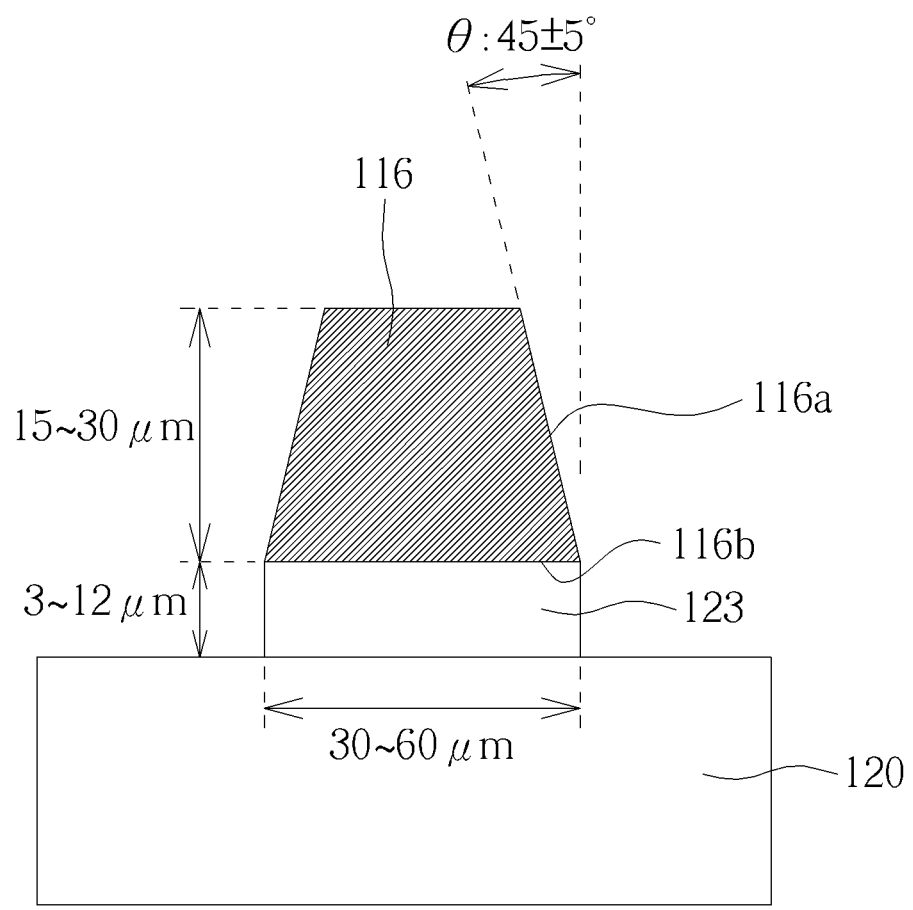
FIG. 13 is a schematic enlarged cross-sectional view of the reflective metal bump in accordance with one embodiment of the present invention.

Please refer to FIG. 13, which is a schematic enlarged cross-sectional view of the reflective metal bump. In the present invention, the height of metal bump 116 may be 15-30 µm, the height of cladding layer 123 may be 3-12 µm, and the width of the base of metal bump 116 may be 30-60 µm. Preferably, the included angel between the reflection plane 116a of metal bump 116 and the normal line vertical to the flexible cover layer 120 is 45±5°.

Figure 14:
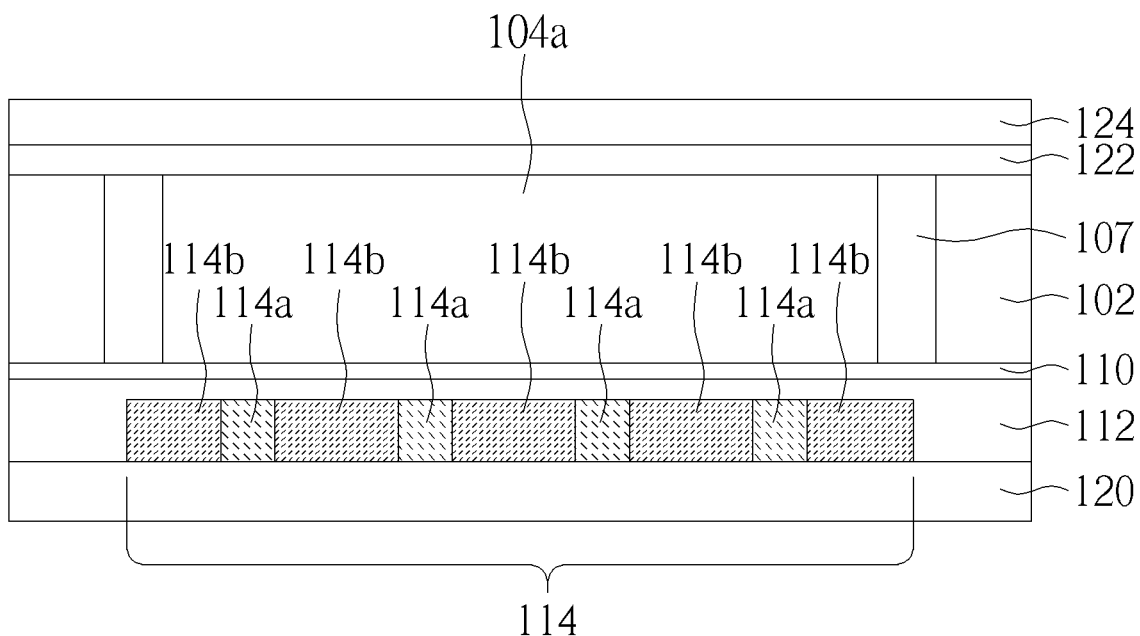
FIG. 14 is a schematic cross-sectional view of the photoelectric transmission unit with embedded optical waveguide structure in accordance with the preferred embodiment of present invention.

Please refer to FIG. 14, which is a schematic cross-sectional view of the photoelectric transmission unit with embedded optical waveguide structure in accordance with the preferred embodiment of present invention. In the embodiment of present invention, the optical waveguide structure 114 may include optical waveguide cores 114a for light transmission and optical waveguide claddings 114b around each optical waveguide core 114a for insulting optical signals between in the optical waveguide cores 114a. The optical waveguide structure 114 is set between the VCSEL diode 104a (right below the light-emitting position of the VCSEL diode 104a) and flexible cover layer 120 and has a width (in direction perpendicular to light transmission path of the optical waveguide structure 114) greater than or approximately equal to the width of VCSEL diode 104a. In order to attain the effect of total internal reflection, the refractive index of optical waveguide cores 114a must be greater than the refractive index of optical waveguide claddings 114b. The material of optical waveguide structure 114 may be polyimide or cyclo-olefin polymer (COP) with excellent optical properties, including high transparency, low birefringence, low water absorption and good heat resistance. The optical waveguide cores 114a and optical waveguide claddings 114b may be made by using the same material, for example polyimide, modified by different treatments like UV curing in a photolithography process, to render them different refractive indices. In the operation, the light emitted from the VCSEL diode 104a is introduced into the optical waveguide cores 114a at one end of the photoelectric transmission unit and be transmitted to the other end of the photoelectric transmission without being scattered since the total internal reflection provided by the optical waveguide cores and claddings.

Figure 15:
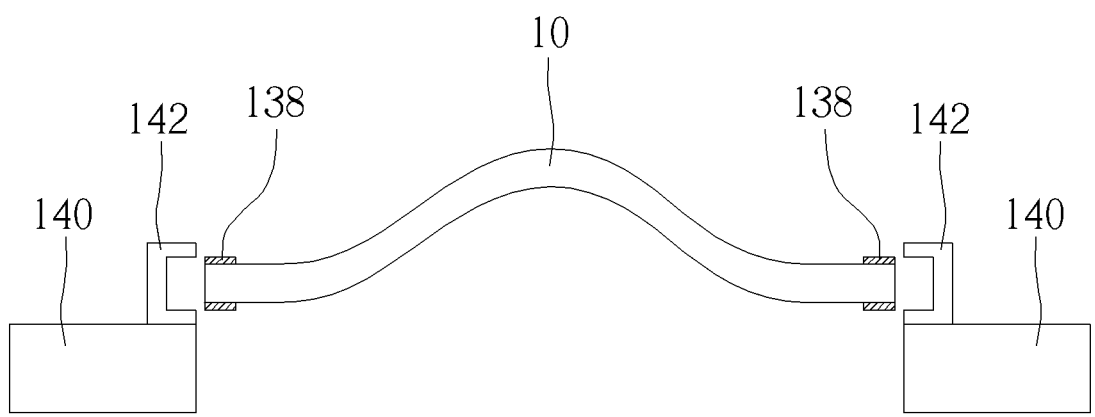
FIG. 15 is a schematic cross-sectional view of the flexible printed circuit board of present invention connecting between two printed circuit boards.

Please refer to FIG. 15, which is a schematic cross-sectional view of the flexible printed circuit board of present invention connecting between two system printed circuit boards. The flexible printed circuit board 10 constituted by multiple photoelectric transmission units 100 may be used to connect two system printed circuit boards 140. The connection may be made by using the contacts 138 of the circuit pattern 126 (ex. golden fingers) formed on the flexible printed circuit board 10 to connect with contacts formed in the connectors (or sockets) 142 mounted on the two system printed circuit boards 140. In other embodiment, the flexible printed circuit board 10 may be connected directly with the contacts formed on system printed circuit boards 140 by solder (for example Sn) rather than the connectors (or sockets), and the connection may be horizontal board-to-board connection or vertical board-to-board connection (flip-port).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flexible printed circuit board with embedded optical waveguide structure, comprising at least one photoelectric transmission unit, wherein each said photoelectric transmission unit comprises:
    a flexible insulation layer;
    a first optoelectronic unit embedded in said photoelectric transmission unit and configured to convert electrical signal into optical signal;
    a second optoelectronic unit embedded in said photoelectric transmission unit and configured to convert optical signal into electrical signal;
    at least one redistribution layer having at least one conductive structure stacked with said flexible insulation layer and electrically connected with said first optoelectronic unit and said second optoelectronic unit;
    an optical waveguide structure stacked with said flexible insulation layer for transmitting optical signal;
    a first metal bump adjacent to said optical waveguide structure and in optical alignment with said first optoelectronic unit to provide a reflection plane for optical signal;
    a second metal bump adjacent to said optical waveguide structure and in optical alignment with said second optoelectronic unit to provide a reflection plane for optical signal; and
    a first flexible cover layer covering on said first metal bump, said second metal bump and said optical waveguide structure;
    wherein said first metal bump and said second metal bump are solid structures made of the same material as the one of said redistribution layer.

2. The flexible printed circuit board with embedded optical waveguide structure of claim 1, wherein said reflection plane of said first metal bump is in optical alignment with a light-emitting position of said first optoelectronic unit, and said reflection plane of said second metal bump is in optical alignment with a light-receiving position of said second optoelectronic unit.

3. The flexible printed circuit board with embedded optical waveguide structure of claim 2, wherein said redistribution layer further comprising at least one dielectric film between said flexible insulation layer and said conductive structure, and two openings are provided in said dielectric film, and said reflection planes of said first metal bump and said second metal bump are aligned respectively with said light-emitting position and said light-receiving position through said two openings.

4. The flexible printed circuit board with embedded optical waveguide structure of claim 1, wherein a material of said reflection plane of said first metal bump and said second metal bump is the same as a material of inner structure of said first metal bump and said second metal bump.

5. The flexible printed circuit board with embedded optical waveguide structure of claim 1, wherein a width of a base of said first metal bump and said second metal bump is 30-60 μm, and a height of said first metal bump and said second metal bump is 15-30 μm.

6. The flexible printed circuit board with embedded optical waveguide structure of claim 1, wherein said first optoelectronic unit comprises a vertical cavity surface emitting laser (VCSEL) diode and a VCSEL driver.

7. The flexible printed circuit board with embedded optical waveguide structure of claim 1, wherein said second optoelectronic unit comprises a photodiode and a transimpedance amplifier (TIA).

8. The flexible printed circuit board with embedded optical waveguide structure of claim 1, further comprising underfill filling in gaps between said first optoelectronic unit, said second optoelectronic unit and said flexible insulation layer.

9. The flexible printed circuit board with embedded optical waveguide structure of claim 1, further comprising a second flexible cover layer covering on the other side of said flexible insulation layer opposite to said first flexible cover layer.

10. The flexible printed circuit board with embedded optical waveguide structure of claim 1, comprising a plurality of said photoelectric transmission units, wherein said photoelectric transmission units are laminated together with said first optoelectronic units at one end and said second optoelectronic units at the other end of said flexible printed circuit board.

11. The flexible printed circuit board with embedded optical waveguide structure of claim 10, further comprising two connectors respectively at said two ends of said flexible printed circuit board, and said two connectors are electrically connected with said first optoelectronic units and said second optoelectronic units through the conductive structure of said redistribution layer.

12. The flexible printed circuit board with embedded optical waveguide structure of claim 1, wherein said optical waveguide structure comprises optical waveguide cores and optical waveguide claddings around each said optical waveguide core, and a refractive index of said optical waveguide cores is greater than a refractive index of said optical waveguide claddings.

13. A method of manufacturing a flexible printed circuit board with embedded optical waveguide structure, comprising:
    embedding a first optoelectronic unit and a second optoelectronic unit in a flexible insulation layer;
    forming at least one redistribution layer having at least one conductive structure stacked with said first optoelectronic unit, said second optoelectronic unit and said flexible insulation layer;
    forming a first metal bump, a second metal bump and an optical waveguide structure on a first flexible cover layer; and
    bonding said first flexible cover layer on one side of said flexible insulation layer, said first optoelectronic unit and said second optoelectronic unit, wherein said optical waveguide structure is in optical alignment respectively with said first metal bump and said second metal bump on said first flexible cover layer;
    wherein said first metal bump and said second metal bump are solid structures made of the same material as the one of said conductive structure of said redistribution layer.

14. The method of manufacturing a flexible printed circuit board with embedded optical waveguide structure of claim 13, further comprising:
    providing said first flexible cover layer, wherein said first flexible cover layer comprises an insulation layer and two metal claddings respectively on two sides of said insulation layer;
    forming a patterned photoresist on one of said metal claddings, wherein said photoresist is provided with opening patterns of said first metal bump and said second metal bump;
    performing an electroplating process to form said first metal bump and said second metal bump on said one of said metal claddings;
    removing said patterned photoresist;
    performing an etching process to remove said metal claddings exposed from said first metal bump and said second metal bump; and
    forming said optical waveguide structure on said insulation layer between said first metal bump and said second metal bump.

15. The method of manufacturing a flexible printed circuit board with embedded optical waveguide structure of claim 14, further comprising:
    forming patterned photoresist on the other said metal claddings; and
    performing an electroplating process to form circuit patterns on said the other one of said metal claddings.

16. The method of manufacturing a flexible printed circuit board with embedded optical waveguide structure of claim 14, wherein said first flexible cover layer is flexible metal clad laminate, said first metal bump, said second metal bump and said optical waveguide structure are provided on said first flexible metal clad laminate, and both of said first metal bump and said second metal bump is provided with a reflection plane, and two ends of said optical waveguide structure contact respectively with said reflection planes of said first metal bump and said second metal bump.

17. The method of manufacturing a flexible printed circuit board with embedded waveguide structure of claim 13, wherein said first flexible cover layer are bonded on said flexible insulation layer through an adhesion layer with a side of said first metal bump, said second metal bump and said optical waveguide structure.

18. The method of manufacturing a flexible printed circuit board with embedded optical waveguide structure of claim 13, further comprising:
    providing a temporary substrate; and
    attaching said first optoelectronic unit, said second optoelectronic unit and said flexible insulation layer on said temporary substrate.

19. The method of manufacturing a flexible printed circuit board with embedded optical waveguide structure of claim 18, further comprising filling underfill in gaps between said first optoelectronic unit, said second optoelectronic unit, and said flexible insulation layer.

20. The method of manufacturing a flexible printed circuit board with embedded optical waveguide structure of claim 13, further comprising laminating a plurality of said photoelectric transmission units to form said flexible printed circuit board, with said first optoelectronic units at one end and said second optoelectronic units at the other end of said flexible printed circuit board, and said optical waveguide structures are connected between said first optoelectronic units and said second optoelectronic units.

21. The method of manufacturing a flexible printed circuit board with embedded optical waveguide structure of claim 13, further comprising bonding a second flexible cover layer on the other side of said flexible insulation layer.

22. The method of manufacturing a flexible printed circuit board with embedded optical waveguide structure of claim 21, further comprising forming interconnects extending through said flexible insulation layer and electrically connected with said redistribution layer and circuit patterns on said first flexible cover layer and said second flexible cover layer.

23. The method of manufacturing a flexible printed circuit board with embedded optical waveguide structure of claim 13, further comprising connecting two connectors respectively with said first optoelectronic units and said second optoelectronic units at said two ends of said flexible printed circuit board through said redistribution layer.

24. The method of manufacturing a flexible printed circuit board with embedded optical waveguide structure of claim 13, wherein said optical waveguide structure comprises optical waveguide cores and optical waveguide claddings around each said optical waveguide core, and a refractive index of said optical waveguide cores is greater than a refractive index of said optical waveguide claddings.

25. The method of manufacturing a flexible printed circuit board with embedded optical waveguide structure of claim 23, wherein steps of forming said optical waveguide cores and said optical waveguide claddings comprise:

forming an optical waveguide material on said first flexible cover layer; and performing a photolithography process to said optical waveguide material so as to form patterned optical waveguide cores and optical waveguide claddings with different refractive indices.

\* \* \* \* \*